(12) United States Patent
Komatsu et al.

(10) Patent No.: US 12,027,387 B2
(45) Date of Patent: Jul. 2, 2024

(54) HOLDING DEVICE

(71) Applicant: NGK SPARK PLUG CO., LTD., Nagoya (JP)

(72) Inventors: Takahisa Komatsu, Sendai (JP); Kazutaka Tanaka, Sendai (JP)

(73) Assignee: NITERRA CO., LTD., Nagoya (JP)

( * ) Notice: Subject to any disclaimer, the term of this patent is extended or adjusted under 35 U.S.C. 154(b) by 406 days.

(21) Appl. No.: 17/607,241

(22) PCT Filed: Dec. 10, 2020

(86) PCT No.: PCT/JP2020/046048
§ 371 (c)(1),
(2) Date: Oct. 28, 2021

(87) PCT Pub. No.: WO2021/145110
PCT Pub. Date: Jul. 22, 2021

(65) Prior Publication Data
US 2022/0223438 A1    Jul. 14, 2022

(30) Foreign Application Priority Data

Jan. 15, 2020 (JP) .................................. 2020-004065

(51) Int. Cl.
*H01L 21/687* (2006.01)
*C23C 14/34* (2006.01)
(Continued)

(52) U.S. Cl.
CPC ........ *H01L 21/67103* (2013.01); *C23C 14/34* (2013.01); *C23C 14/50* (2013.01);
(Continued)

(58) Field of Classification Search
CPC . H01L 21/67103; B25B 11/00; B25B 11/005; B25B 11/02
See application file for complete search history.

(56) References Cited

U.S. PATENT DOCUMENTS

| 5,983,906 A | 11/1999 | Zhao et al. |
| 6,051,286 A | 4/2000 | Zhao et al. |

(Continued)

FOREIGN PATENT DOCUMENTS

| JP | H10-298767 A | 11/1998 |
| KR | 10-2004-0038753 A | 5/2004 |

OTHER PUBLICATIONS

Korean Intellectual Property Office. Office Action (Request for the Submission of an Opinion) issued in corresponding Korean Patent Application No. 10-2021-7034152, dated Aug. 8, 2023.
(Continued)

*Primary Examiner* — Lee D Wilson
(74) *Attorney, Agent, or Firm* — Stites & Harbison, PLLC; Jeffrey A. Haeberlin (57) ABSTRACT

A holding device includes a plate-shaped member, a tubular member, and a connecting member. The tubular member is made of ceramic and is joined to plate-shaped member at an end thereof. The tubular member has, at an other end thereof, a flange portion having a first through-hole. The connecting member is disposed on the other side of the tubular member and has, in a third surface, which is an end face of the connecting member, a hole into which a fastening member inserted through the first through-hole in the flange portion is to be screwed. A specific portion, which is a portion in an outer edge line of a fourth surface of the tubular member, the portion overlapping a minimum virtual circle covering the fourth surface, is not in contact with the third surface of the connecting member.

13 Claims, 8 Drawing Sheets

(51) Int. Cl.
      *C23C 14/50*       (2006.01)
      *C23C 16/458*     (2006.01)
      *H01J 37/32*       (2006.01)
      *H01J 37/34*       (2006.01)
      *H01L 21/67*       (2006.01)

(52) U.S. Cl.
     CPC ...... *C23C 16/458* (2013.01); *H01J 37/32715* (2013.01); *H01J 37/3438* (2013.01); *H01J 2237/332* (2013.01); *H01J 2237/334* (2013.01)

(56) References Cited

U.S. PATENT DOCUMENTS

| | | | |
|---|---|---|---|
| 6,189,482 B1 | 2/2001 | Zhao et al. | |
| 10,388,560 B2* | 8/2019 | Takebayashi | H01L 21/68757 |
| 10,655,225 B2* | 5/2020 | Gomm | C23C 16/4581 |
| 2001/0054385 A1* | 12/2001 | Horiguchi | C23C 16/4586 |
| | | | 118/723 R |
| 2004/0194710 A1 | 10/2004 | Hanamachi et al. | |
| 2006/0186109 A1* | 8/2006 | Goto | H01L 21/67103 |
| | | | 219/444.1 |
| 2006/0199131 A1* | 9/2006 | Kawasaki | H01L 21/67103 |
| | | | 432/120 |
| 2020/0294837 A1* | 9/2020 | Zeng | H05K 1/0284 |
| 2021/0164103 A1* | 6/2021 | Ifuku | H01L 21/02115 |
| 2022/0223438 A1* | 7/2022 | Komatsu | C23C 16/4586 |

OTHER PUBLICATIONS

Japan Patent Office, International Search Report issued in corresponding Application No. PCT/JP2020/046048 mailed Mar. 9, 2021.

\* cited by examiner

HOLDING DEVICE

TECHNICAL FIELD

A technique disclosed in this specification relates to a holding device that holds an object.

BACKGROUND ART

A known heating device (also called a "susceptor") heats an object (for example, a semiconductor wafer) to a predetermined temperature (for example, approximately 400 to 800° C.) while holding the object. The heating device is used, for example, as a part of a semiconductor manufacturing apparatus, such as a film deposition apparatus (a CVD film deposition apparatus, a sputtering film deposition apparatus, etc.) and an etching apparatus (a plasma etching apparatus, etc.).

Typically, a heating device includes a plate-like member and a tubular member. The plate-like member is a plate-shaped member having a surface (hereinbelow, a "holding surface") substantially perpendicular to a predetermined direction (hereinbelow, a "first direction") and a surface (hereinbelow, a "back surface") on the side opposite to the holding surface. The tubular member (also called a "shaft") is a tube-shaped member extending in the first direction and is joined to the back surface of the plate-like member at an end on one side in the first direction. A heater electrode, which is a resistive heating element, is provided inside the plate-like member. When a voltage is applied to the heater electrode, the heater electrode generates heat, and an object held on the holding surface of the plate-like member is heated.

The heating device further includes a connecting member (also called an "adapter") disposed on the other side (the side opposite to the side facing the plate-like member) of the tubular member in the first direction. The connecting member is a member via which the tubular member is connected to another member (for example, a vacuum chamber). The connecting member is made of a metal material, such as, for example, aluminum.

The tubular member and the connecting member of the heating device are joined together with a fastening member, such as a bolt (for example, see Patent Literature 1). More specifically, a flange portion is formed at an end of the tubular member on the side facing the connecting member, and the flange portion has a through-hole. As a result of the fastening member being inserted through the through-hole in the flange portion and being screwed into a hole formed in the surface of the connecting member on the side facing the tubular member, the tubular member and the connecting member are joined together.

CITATION LIST

Patent Literature

Patent Literature 1: Japanese Unexamined Patent Application Publication No. H10-298767

SUMMARY OF INVENTION

Technical Problem

Typically, the tubular member of the heating device is made of ceramic, which is easy to chip. Hence, if there is a slight inclination between the tubular member and the connecting member in fastening the two members together with a fastening member, the connecting member may come into contact with a portion near the outer edge line of the end face (the face facing the connecting member) of the tubular member, and the portion near the outer edge line may chip.

Note that this problem is not specific to heating devices, but is common among typical holding devices that have a plate-like member, a ceramic tubular member, and a connecting member and hold an object on the surface of the plate-like member.

This specification discloses a technique capable of solving the above-described problem.

Solution to Problem

The technique disclosed in this specification can be implemented, for example, in the aspects below.

(1) A holding device disclosed in this specification includes: a plate-like member having a first surface substantially perpendicular to a first direction, and a second surface on a side opposite to the first surface; and a tubular member extending in the first direction, made of ceramic, joined to the second surface of the plate-like member at an end of the tubular member on one side in the first direction, and having a flange portion at an end of the tubular member on the other side in the first direction, the flange portion projecting in a direction substantially perpendicular to the first direction and having a first through-hole extending in the first direction. The holding device holds an object on the first surface of the plate-like member. The holding device further includes a connecting member disposed on the other side of the tubular member in the first direction, the connecting member having a hole in a third surface, which is an end face of the connecting member on the one side in the first direction, into which a fastening member inserted through the first through-hole in the flange portion is to be screwed. A portion of a fourth surface, which is an end face of the tubular member on the other side in the first direction, is in contact with the third surface of the connecting member. A specific portion, which is a portion in an outer edge line of the fourth surface of the tubular member, the portion overlapping a minimum virtual circle covering the fourth surface, is not in contact with the third surface of the connecting member.

The outer edge line portion of the fourth surface (the end face on the side facing the connecting member) of the tubular member described above is a portion where chipping of the tubular member due to contact with the connecting member is likely to occur when there is a slight inclination between the tubular member and the connecting member in fastening the tubular member and the connecting member together with the fastening member. In particular, in the outer edge line of the fourth surface of the tubular member, the specific portion (i.e., the extreme outer circumferential portion of the outer edge line), which is a portion overlapping the minimum virtual circle covering the fourth surface, is a portion where the above-described chipping is most likely to occur. As described above, in this holding device, the specific portion in the outer edge line of the fourth surface of the tubular member is not in contact with the third surface of the connecting member. Hence, in this holding device, even when there is a slight inclination between the aforementioned two members, it is possible to prevent or reduce contact between the specific portion in the outer edge line of the fourth surface of the tubular member and the connecting member. As a result, it is possible to prevent or reduce the occurrence of chipping of the tubular member.

(2) In the above-described holding device, the entirety of the outer edge line of the fourth surface of the tubular member may not be in contact with the third surface of the connecting member. This configuration can more reliably prevent or reduce the occurrence of chipping of the tubular member.

(3) In the above-described holding device, the third surface of the connecting member has a portion overlapping the specific portion in the outer edge line of the fourth surface of the tubular member, as viewed in the first direction, and the third surface of the connecting member and the specific portion in the outer edge line of the fourth surface of the tubular member may be spaced from each other in the first direction. This configuration can prevent or reduce the occurrence of chipping of the tubular member, regardless of the size relationship between the outside diameter of the flange portion of the tubular member and the outside diameter of the connecting member.

(4) The above-described holding device may further include a spacer disposed on the one side of the flange portion in the first direction and having a second through-hole that communicates with the first through-hole in the flange portion and through which the fastening member is inserted. A portion of a fifth surface, which is an end face of the flange portion on the one side in the first direction, may be in contact with a sixth surface, which is an end face of the spacer on the other side in the first direction, and the entirety of an outer edge line of the fifth surface of the flange portion may not be in contact with the sixth surface of the spacer. In a form in which the tubular member and the connecting member are fastened together via the spacer, the above-described outer edge line portion of the fifth surface (the end face on the side facing the spacer) of the flange portion of the tubular member is a portion where chipping of the tubular member due to contact with the spacer is likely to occur when there is a slight inclination between the spacer and the tubular member. In the above-described configuration, the entirety of the outer edge line of the fifth surface of the flange portion of the tubular member is not in contact with the sixth surface of the spacer. Hence, with the above-described configuration, even when there is a slight inclination between the aforementioned two members, it is possible to prevent or reduce contact between the outer edge line portion of the fifth surface of the flange portion of the tubular member and the spacer. As a result, it is possible to prevent or reduce the occurrence of chipping of the tubular member.

(5) In the above-described holding device, the flange portion of the tubular member may have a plurality of the first through-holes, and the connecting member may have a plurality of the holes into which a plurality of the fastening members inserted through the plurality of the first through-holes in the flange portion are to be screwed. With this configuration, in fastening together the tubular member and the connecting member with the plurality of fastening members, a slight inclination is likely to occur between the tubular member and the connecting member due to variation in the fastening force of the fastening members, and thus, the above-described chipping is likely to occur. However, in this holding device, because the specific portion in the outer edge line of the fourth surface of the tubular member is not in contact with the third surface of the connecting member, it is possible to prevent or reduce contact between the specific portion in the outer edge line of the fourth surface of the tubular member and the connecting member. As a result, it is possible to prevent or reduce the occurrence of chipping of the tubular member.

(6) The above-described holding device may further include the fastening member. With this configuration, in the holding device having the fastening member for fastening together the tubular member and the connecting member, it is possible to prevent or reduce contact between the specific portion in the outer edge line of the fourth surface of the tubular member and the connecting member. As a result, it is possible to prevent or reduce the occurrence of chipping of the tubular member.

(7) The above-described holding device may further include an internal electrode provided inside the plate-like member. With this configuration, in the holding device having the internal electrode provided inside the plate-like member, it is possible to prevent or reduce contact between the specific portion in the outer edge line of the fourth surface of the tubular member and the connecting member. As a result, it is possible to prevent or reduce the occurrence of chipping of the tubular member.

Note that the technique disclosed in this specification may be implemented in various aspects and may be implemented in aspects of, for example, heating devices, holding devices, and methods for manufacturing those devices.

DESCRIPTION OF EMBODIMENTS

A. Embodiment

A-1. Configuration of Heating Device 100

Figure 1:
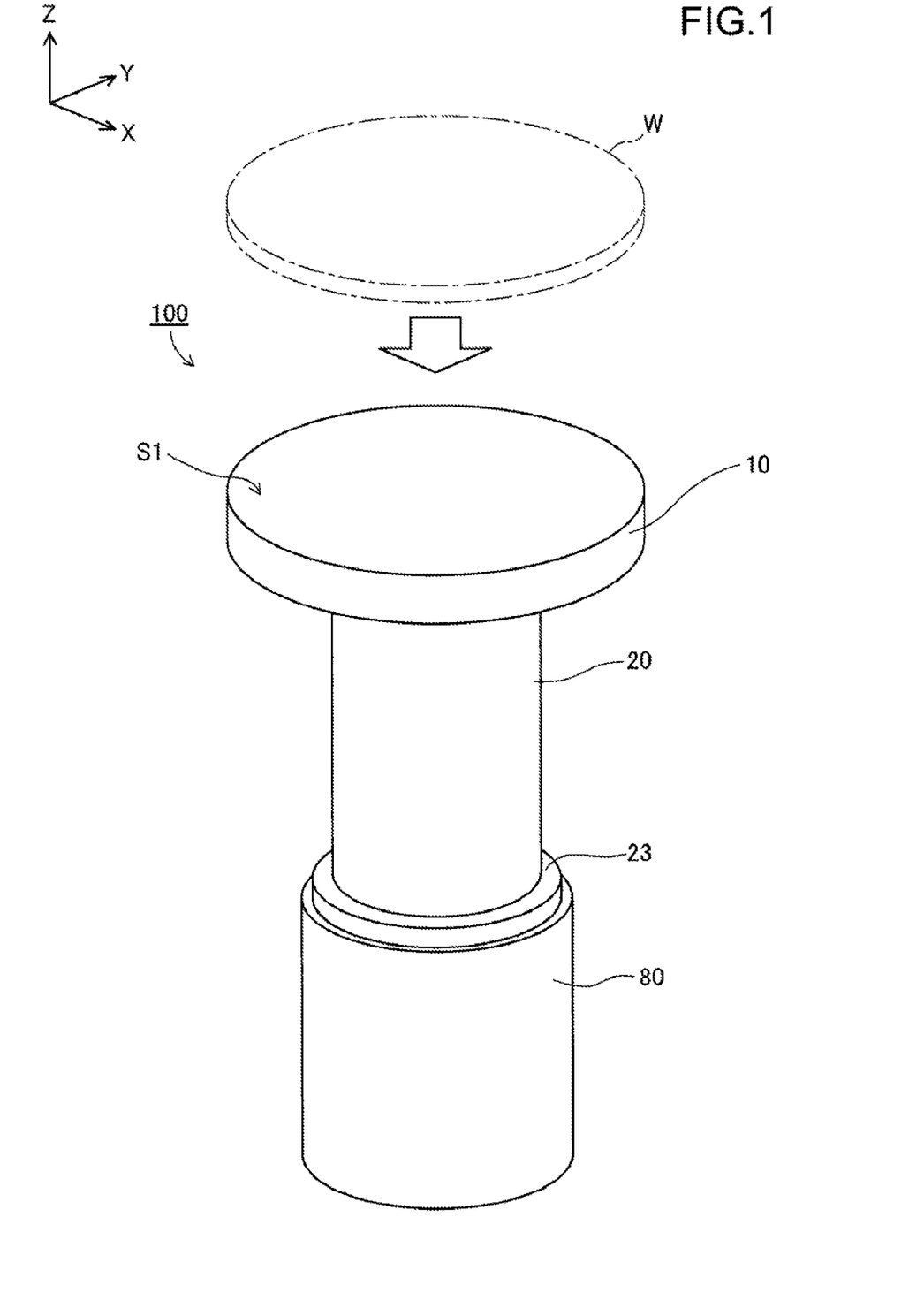
FIG. 1 is a perspective view schematically illustrating an external configuration of a heating device 100 according to this embodiment.
Figure 2:
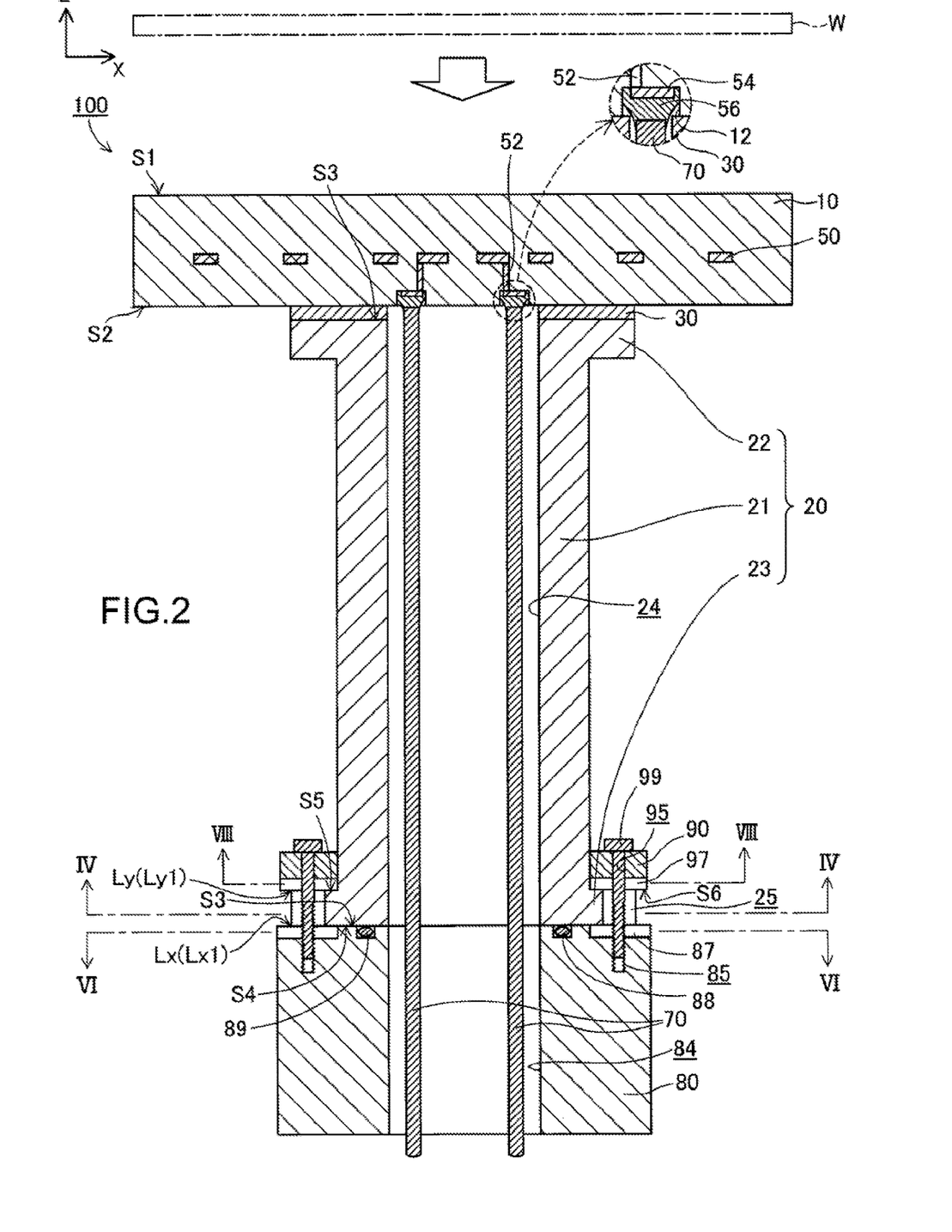
FIG. 2 is an explanatory diagram schematically illustrating a sectional configuration of the heating device 100 according to this embodiment.

FIG. 1 is a perspective view schematically illustrating an external configuration of a heating device 100 according to this embodiment, and FIG. 2 is an explanatory diagram schematically illustrating a sectional configuration of the heating device 100 according to this embodiment. FIG. 2 illustrates an XZ sectional configuration of the heating device 100 at positions II-II in FIGS. 3 to 8 described below. In each drawing, XYZ axes perpendicular to one another for specifying the directions are indicated. In this specification, for convenience's sake, a positive Z-axis direction will be called an upper direction, and a negative Z-axis direction will be called a lower direction. However, in practice, the heating device 100 may be installed in a direction different from such a direction.

The heating device 100 is a device that heats an object (for example, a semiconductor wafer W) to a predetermined temperature (for example, approximately 400 to 800° C.)

while holding the object and is also called a susceptor. The heating device 100 is used, for example, as a part of a semiconductor manufacturing apparatus, such as a film deposition apparatus (a CVD film deposition apparatus, a sputtering film deposition apparatus, etc.) and an etching apparatus (a plasma etching apparatus, etc.). The heating device 100 is an example of a holding device in CLAIMS.

As illustrated in FIGS. 1 and 2, the heating device 100 includes a plate-like member 10, a tubular member 20, and a connecting member 80.

The plate-like member 10 is a substantially circular plate-like member having a surface (hereinbelow, a "holding surface S1") substantially perpendicular to a predetermined direction (in this embodiment, the Z-axis direction) and a surface (hereinbelow, a "back surface S2") on the side opposite to the holding surface S1. The plate-like member 10 is made of ceramic, such as aluminum nitride (AlN) or alumina ($Al_2O_3$). The diameter of the plate-like member 10 is, for example, approximately from 100 mm to 500 mm, and the thickness (the length in the upper-lower direction) of the plate-like member 10 is, for example, approximately from 3 mm to 20 mm. The holding surface S1 of the plate-like member 10 is an example of a first surface in CLAIMS, the back surface S2 is an example of a second surface in CLAIMS, the Z-axis direction is an example of a first direction in CLAIMS, the upper side in the Z-axis direction is an example of one side in the first direction in CLAIMS, and the lower side in the Z-axis direction is an example of the other side in the first direction in CLAIMS.

The tubular member 20 is a substantially circular tube-shaped member extending in the predetermined direction (Z-axis direction). The tubular member 20 is made of ceramic, such as aluminum nitride or alumina, like the plate-like member 10. In this embodiment, the tubular member 20 has an upper flange portion 22 projecting in a direction (hereinbelow, a "plane direction") perpendicular to the Z-axis direction at the end thereof on the upper side (the side facing the plate-like member 10), and a lower flange portion 23 projecting in the plane direction at the end thereof on the lower side (the side facing the connecting member 80). The upper flange portion 22 and the lower flange portion 23 are formed over the entirety of the tubular member 20 in the circumferential direction. Note that, in the description below, the portion of the tubular member 20 other than the upper flange portion 22 and the lower flange portion 23 will be called a body part 21. The outside diameter of the body part 21 of the tubular member 20 is, for example, approximately from 30 mm to 90 mm, and the height (the length in the upper-lower direction) of the tubular member 20 is, for example, approximately from 100 mm to 300 mm. The lower flange portion 23 is an example of a flange portion in CLAIMS.

The plate-like member 10 and the tubular member 20 are arranged such that the back surface S2 of the plate-like member 10 and an upper surface S3 of the tubular member 20 face each other in the upper-lower direction. The tubular member 20 is joined to the central portion of the back surface S2 of the plate-like member 10 via a joint part 30 made of a known joining material.

As illustrated in FIG. 2, a heater electrode 50, which is a heating resistor, is provided inside the plate-like member 10. The heater electrode 50 is made of, for example, a material containing metal, such as tungsten or molybdenum. In this embodiment, the heater electrode 50 forms a substantially concentrically extending linear pattern, as viewed in the Z-axis direction. The ends of the linear pattern of the heater electrode 50 are located near the center of the plate-like member 10, and the ends are connected to the upper ends of via conductors 52. A pair of recesses 12 are formed in the back surface S2 of the plate-like member 10, and conductive feeding electrodes (electrode pads) 54 are provided at the positions of the recesses 12. In this embodiment, the feeding electrodes 54 are substantially circular as viewed in the Z-axis direction and are made of a material containing tungsten (for example, a mixed material of tungsten and aluminum nitride). The lower ends of the via conductors 52 are connected to the feeding electrodes 54. As a result, the heater electrode 50 and the feeding electrodes 54 are electrically connected to each other through the via conductors 52.

The tubular member 20 has a through-hole 24 extending over the overall length of the tubular member 20 in the Z-axis direction. The through-hole 24 accommodates a plurality of terminal members 70. The terminal members 70 are, for example, substantially cylindrical members as viewed in the Z-axis direction and are made of a material containing nickel (Ni) (for example, pure nickel or an alloy containing nickel (for example, Kovar)). The upper ends of the terminal members 70 are joined to the feeding electrodes 54 through a metal brazing material 56 (for example, gold solder).

When a power supply (not shown) applies a voltage to the heater electrode 50 through the terminal members 70, the feeding electrodes 54, the via conductors 52, and the like, the heater electrode 50 generates heat, and an object (for example, a semiconductor wafer W) held on the holding surface S1 of the plate-like member 10 is heated to a predetermined temperature (for example, approximately 400 to 800° C.).

The connecting member 80 is a member disposed below the tubular member 20 and via which the tubular member 20 is attached to another member (for example, a vacuum chamber (not shown)). The connecting member 80 has, for example, a substantially cylindrical shape extending in the predetermined direction (Z-axis direction) and is made of, for example, a metal material, such as aluminum. The connecting member 80 and the tubular member 20 are arranged such that the upper surface S3 of the connecting member 80 and the lower surface S4 of the tubular member 20 face each other in the Z-axis direction and are joined to each other with a plurality of bolts 99, as described below. The connecting member 80 has a through-hole 84 communicating with the through-hole 24 in the tubular member 20. The terminal members 70 mentioned above are disposed in a space formed by the through-hole 24 in the tubular member 20 and the through-hole 84 in the connecting member 80. The upper surface S3 of the connecting member 80 is an example of a third surface in CLAIMS, and the lower surface S4 of the tubular member 20 is an example of a fourth surface in CLAIMS.

Note that, as illustrated in FIGS. 3 to 6 described below, the body part 21 of the tubular member 20 has a plurality of through-holes 26 extending in the Z-axis direction, and the connecting member 80 has a plurality of through-holes 86 extending in the Z-axis direction and communicating with the through-holes 26 in the tubular member 20. The spaces (the spaces extending in the Z-axis direction) formed by the through-holes 26 in the tubular member 20 and the through-holes 86 in the connecting member 80 are used as, for example, gas flow paths to which an inert gas, such as nitrogen or argon, is supplied to form an air curtain (not shown) surrounding the holding surface S1 of the plate-like member 10, the semiconductor wafer W, and the like, or are used as a space for accommodating a high-frequency body (not shown) connected to a high-frequency electrode (not shown) disposed in the plate-like member 10.

Figure 3:
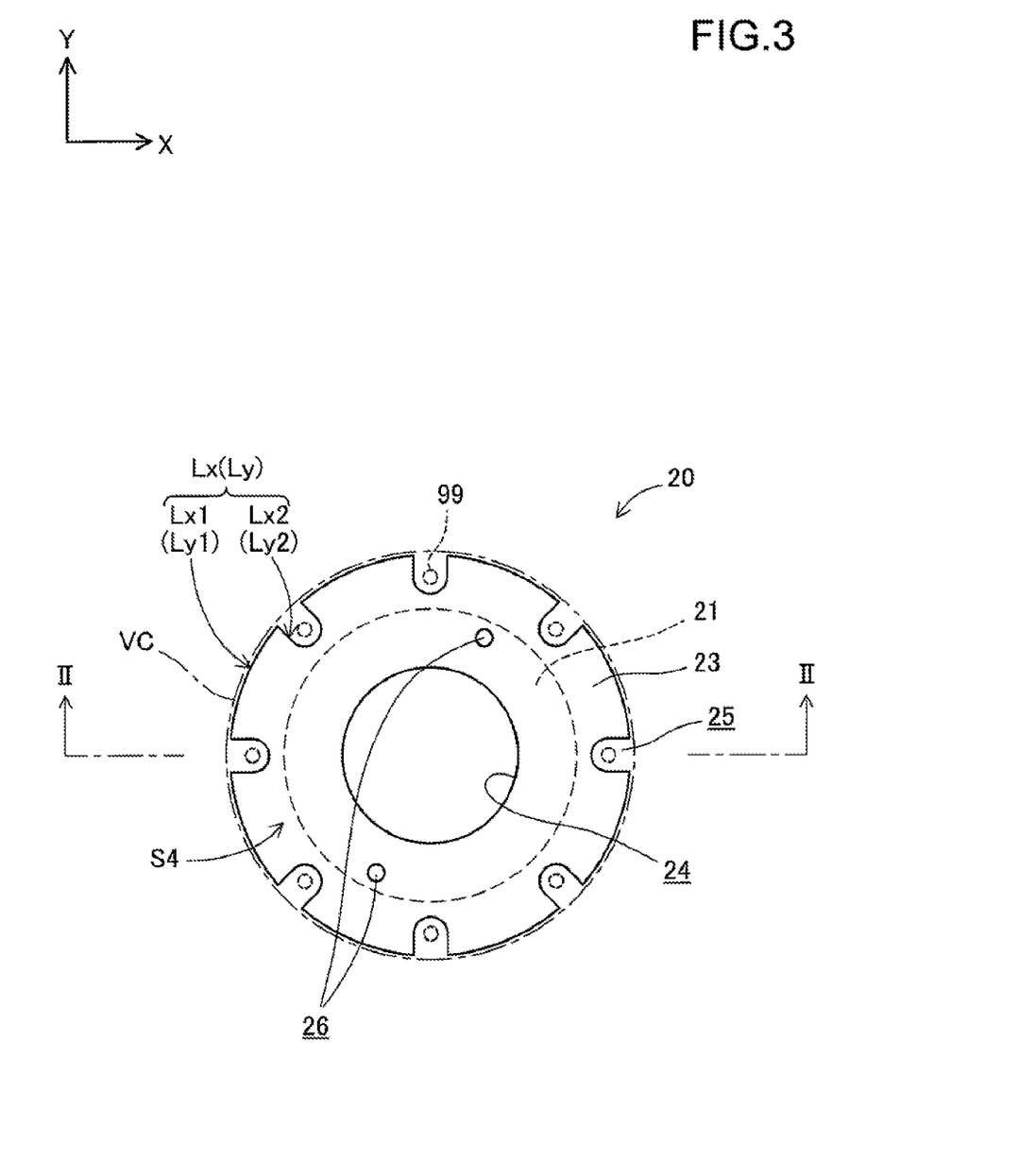
FIG. 3 is an explanatory diagram illustrating a configuration of a lower surface S4 of a tubular member 20.
Figure 4:
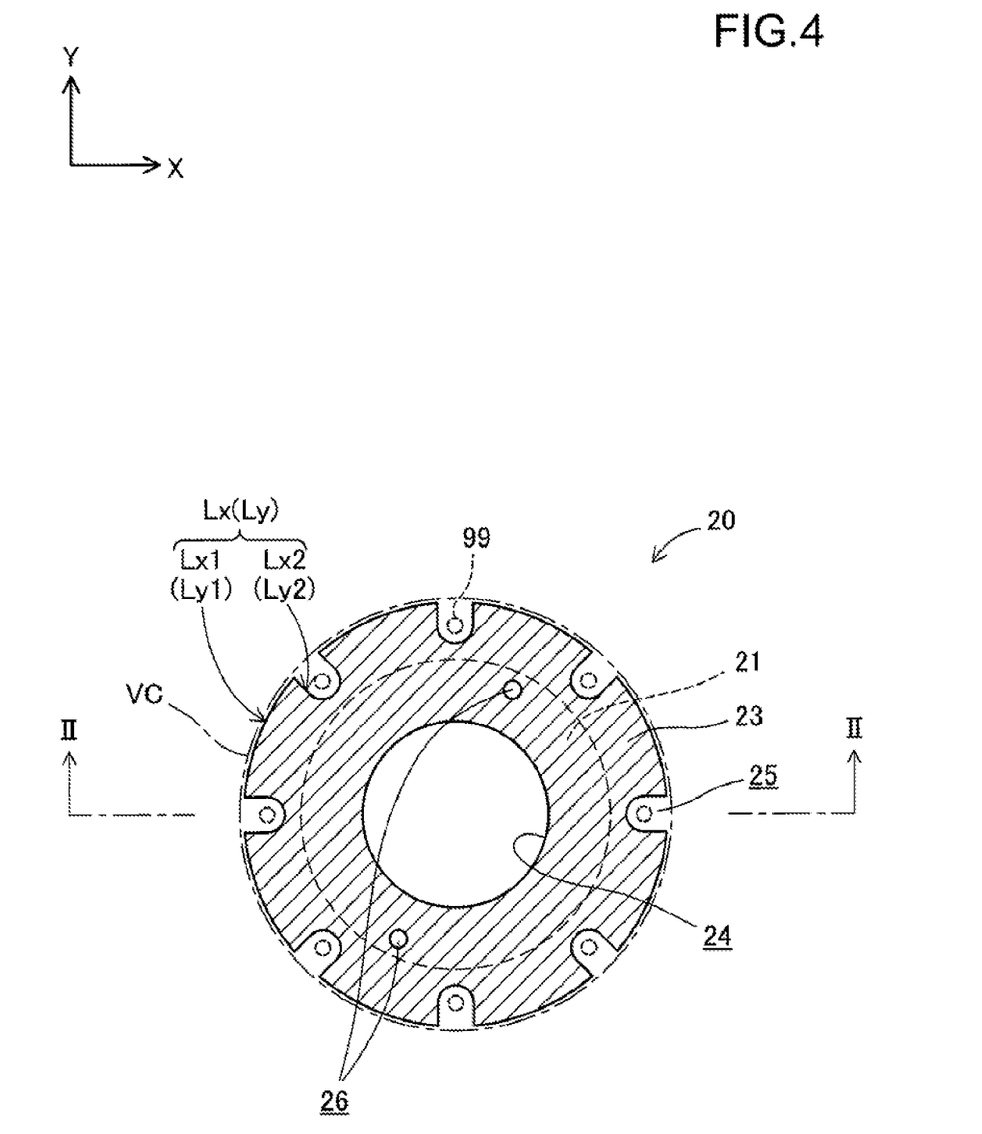
FIG. 4 is an explanatory diagram illustrating a sectional configuration of the tubular member 20.
Figure 5:
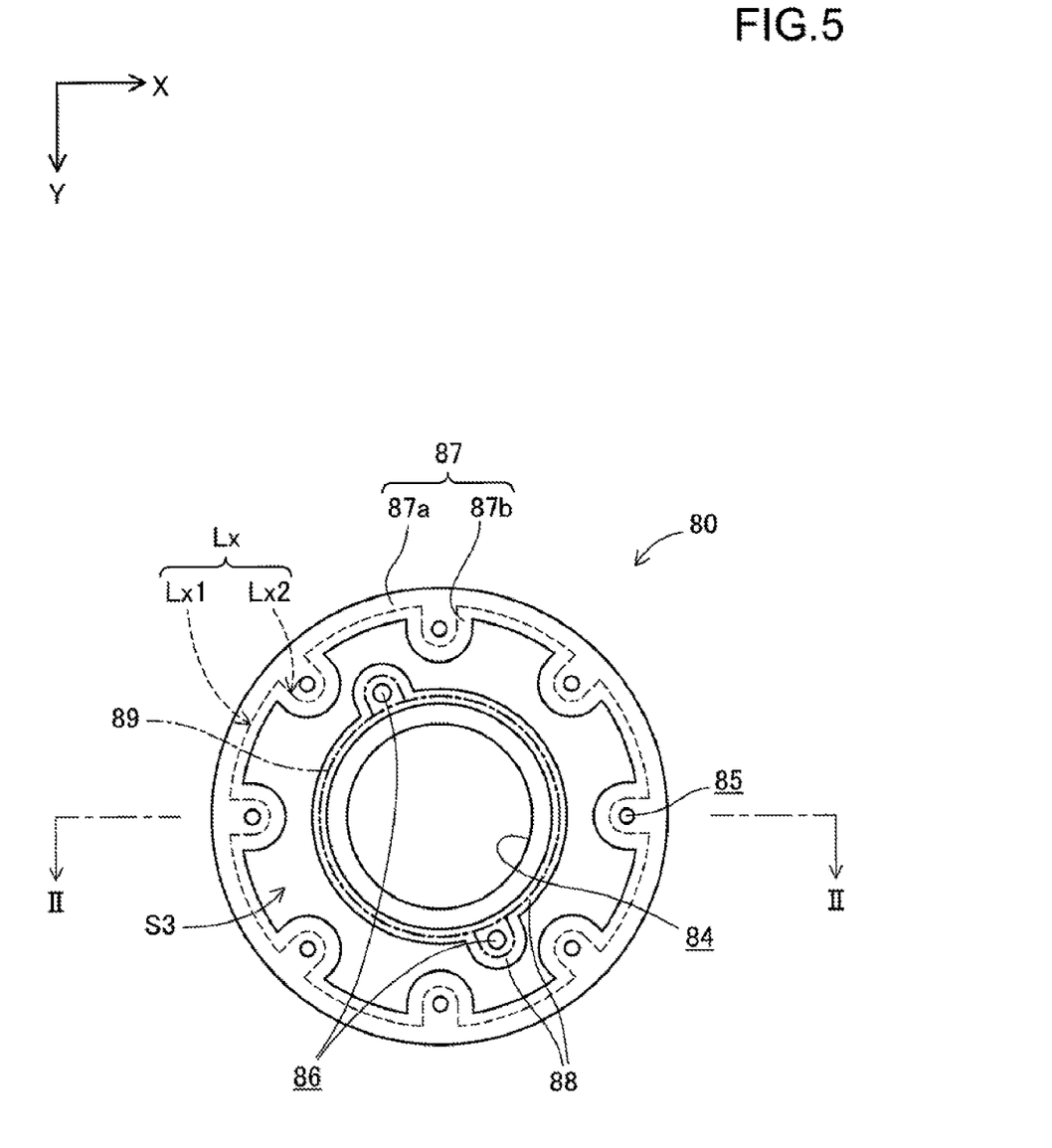
FIG. 5 is an explanatory diagram illustrating a configuration of an upper surface S3 of a connecting member 80.
Figure 6:
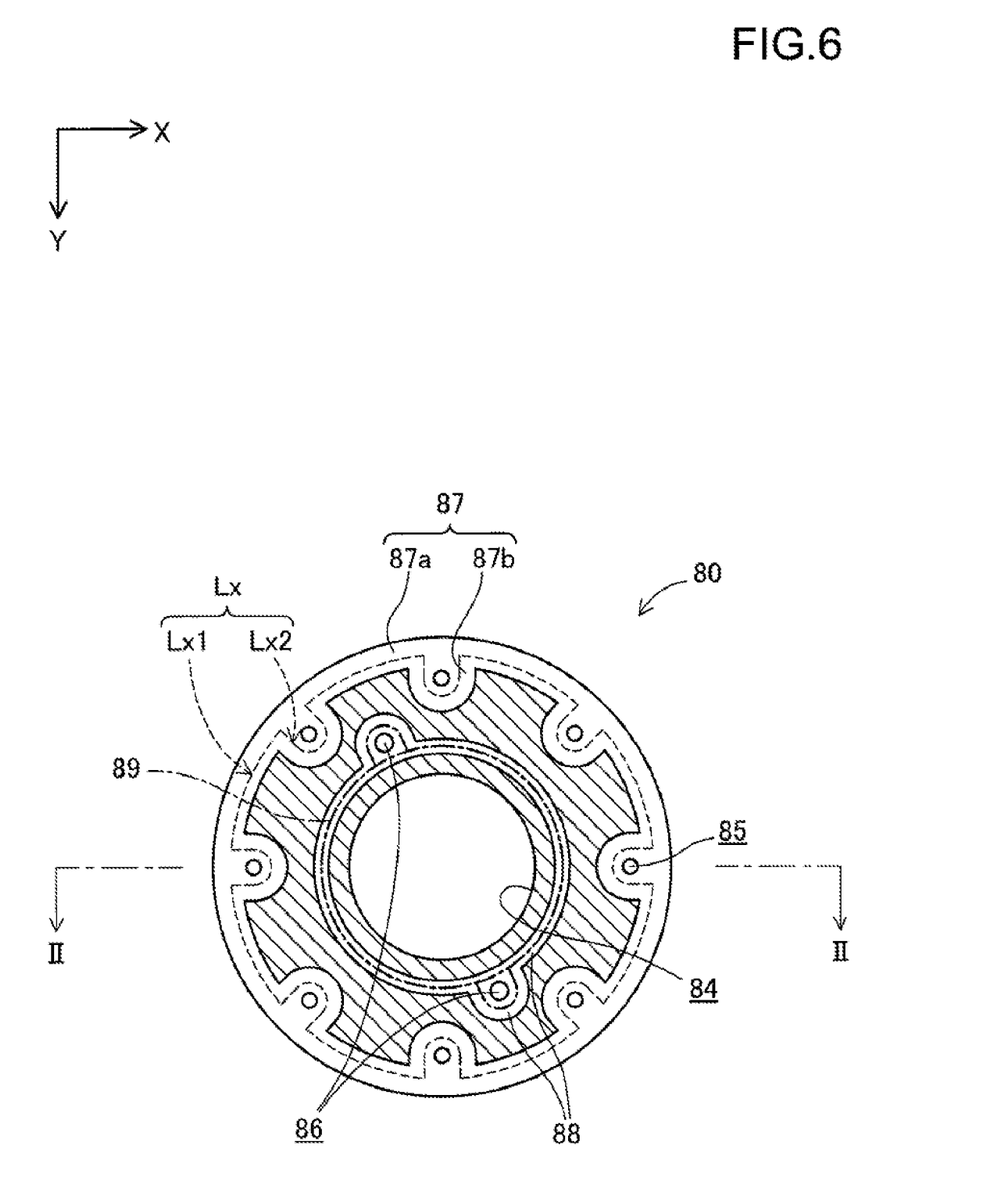
FIG. 6 is an explanatory diagram illustrating a sectional configuration of the connecting member 80.
Figure 7:
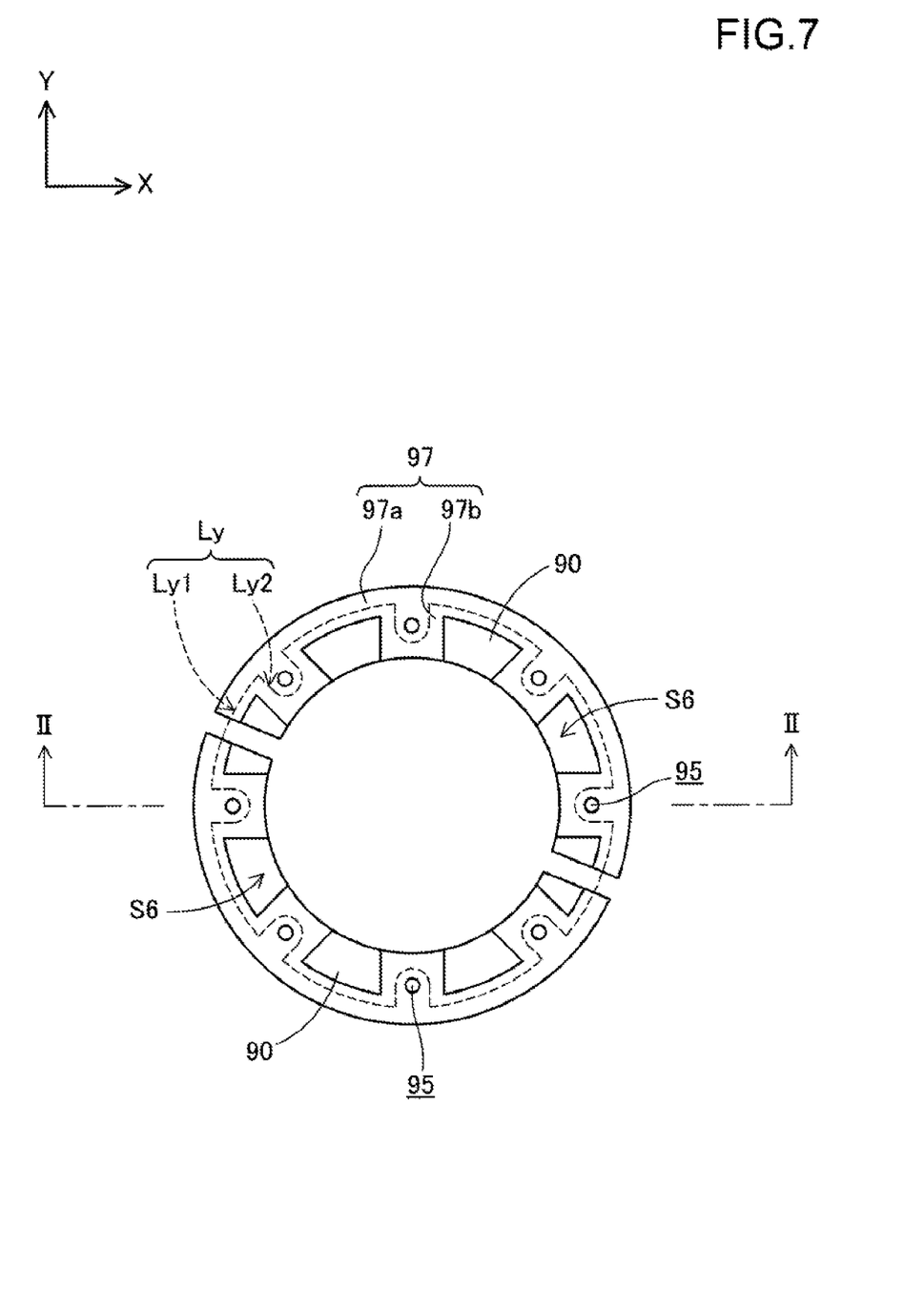
FIG. 7 is an explanatory diagram illustrating a configuration of lower surfaces S6 of spacers 90.
Figure 8:
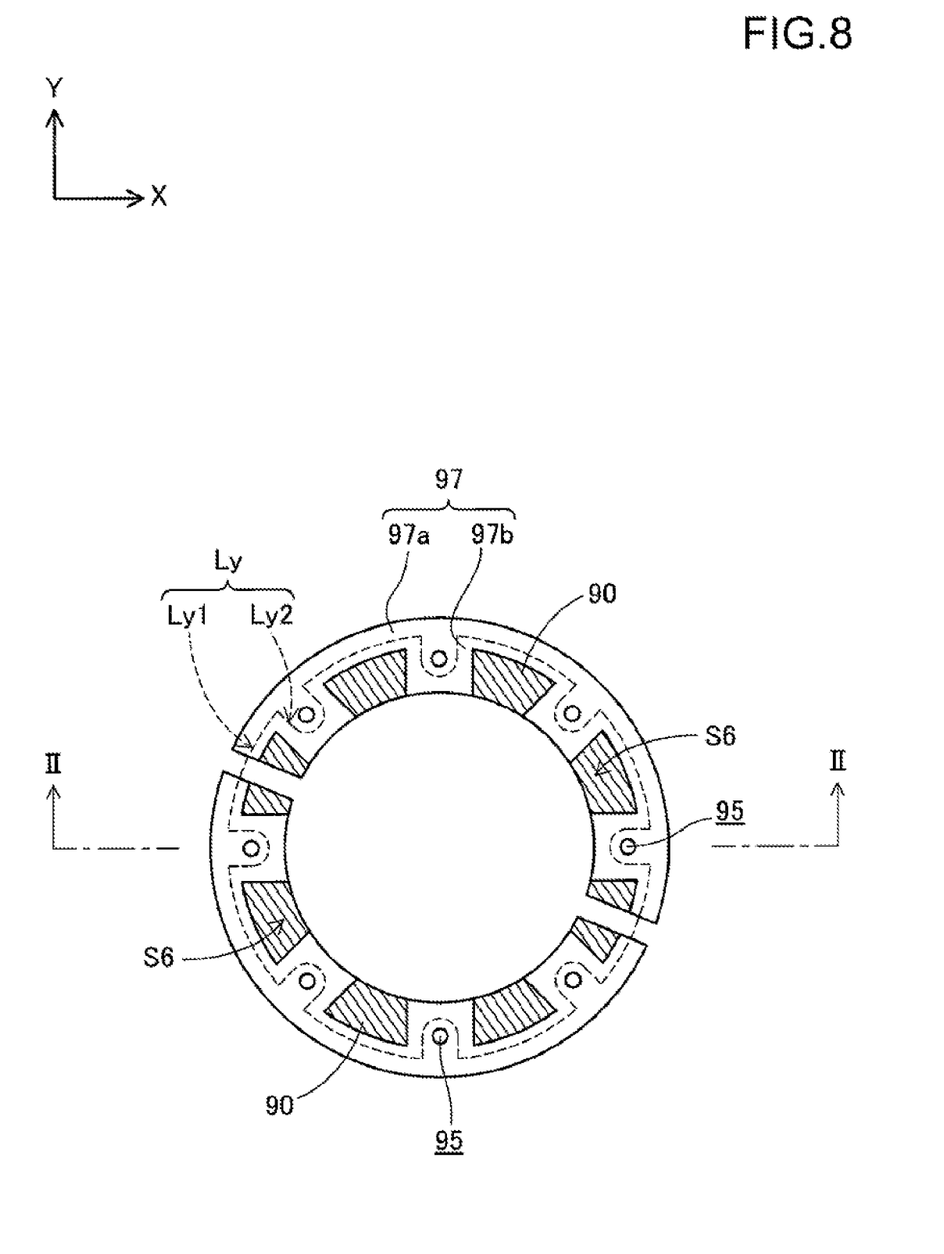
FIG. 8 is an explanatory diagram illustrating a sectional configuration of the spacers 90.

A-2. Detailed Configuration of Joint Part Between Tubular Member 20 and Connecting Member 80 and Vicinity Thereof Next, a detailed configuration of a joint part between the tubular member 20 and the connecting member 80 and the vicinity thereof in the heating device 100 according to this embodiment will be described. FIG. 3 is an explanatory diagram illustrating a configuration of the lower surface S4 of the tubular member 20, FIG. 4 is an explanatory diagram illustrating a sectional configuration of the tubular member 20, FIG. 5 is an explanatory diagram illustrating a configuration of the upper surface S3 of the connecting member 80, FIG. 6 is an explanatory diagram illustrating a sectional configuration of the connecting member 80, FIG. 7 is an explanatory diagram illustrating a configuration of lower surfaces S6 of spacers 90, described below, and FIG. 8 is an explanatory diagram illustrating a sectional configuration of the spacers 90. FIG. 4 illustrates an XY sectional configuration of the tubular member 20 at a position IV-IV in FIG. 2, FIG. 6 illustrates an XY sectional configuration of the connecting member 80 at a position VI-VI in FIG. 2, and FIG. 8 illustrates an XY sectional configuration of the spacers 90 at a position VIII-VIII in FIG. 2.

As described above, the tubular member 20 has the lower flange portion 23 projecting in the plane direction at the lower end thereof (see FIGS. 2 to 4). The lower flange portion 23 is formed over the entirety of the tubular member 20 in the circumferential direction. In this embodiment, the lower flange portion 23 has eight through-holes 25 arranged at substantially equal intervals in the circumferential direction. The through-holes 25 formed in the lower flange portion 23 are holes through which the bolts 99 are to be inserted. Note that, in this embodiment, the through-holes 25 formed in the lower flange portion 23 are not closed holes, but holes (cut-away portions) that are open in the outer circumferential surface of the lower flange portion 23. Specifically, in this specification, through-holes formed in a member and extending in a direction include, in addition to closed holes that are not open in the outer circumferential surface of the member around the direction, holes (cut-away portions) that are open in the outer circumferential surface. The through-holes 25 are examples of a first through-hole in CLAIMS, and the bolts 99 are examples of a fastening member in CLAIMS.

As illustrated in FIGS. 5 and 6, the connecting member 80 has eight bolt holes 85 that are open in the upper surface S3. The bolt holes 85 are arranged at substantially equal intervals in the circumferential direction. A plurality of the bolts 99 inserted through the through-holes 25 in the lower flange portion 23 of the tubular member 20 are screwed into the bolt holes 85 in the connecting member 80 (see FIG. 2). As a result, the tubular member 20 and the connecting member 80 are joined together. The bolt holes 85 are examples of a hole provided in the connecting member 80 in CLAIMS.

As illustrated in FIGS. 5 and 6, a substantially circular-ring-shaped recess (groove) 88 surrounding the through-hole 84 is formed in the upper surface S3 of the connecting member 80, and an O ring 89 is disposed in the recess 88 (see FIG. 2). To avoid complications in the drawings, in FIGS. 5 and 6, the O ring 89 is simply illustrated as a one-dot chain line. Because of the presence of the O ring 89, the space formed by the through-hole 84 is sealed. In this embodiment, the recess 88 is continuously formed at positions where the through-holes 86 are formed, and the O ring 89 has a shape surrounding the through-holes 86. As a result, the spaces formed by the through-holes 86 are also sealed.

The heating device 100 according to this embodiment further has two spacers 90 disposed above the lower flange portion 23 of the tubular member 20 (see FIG. 2). As illustrated in FIGS. 7 and 8, each spacer 90 is a substantially semicircular-arc-shaped plate-like member, as viewed in the Z-axis direction, and is formed of, for example, a metal material, such as aluminum. The two spacers 90 are arranged such that the two spacers 90 together form a substantially circular shape, as viewed in the Z-axis direction. The two spacers 90 forming a pair and arranged in this manner have eight through-holes 95 (that is, four through-holes 95 in each spacer 90) arranged at substantially equal intervals in the circumferential direction. The through-holes 95 communicate with the through-holes 25 provided in the lower flange portion 23 of the tubular member 20, and the bolts 99 are inserted therethrough (see FIG. 2). The two spacers 90 are in contact with the upper surface S5 of the lower flange portion 23 and also with bearing surfaces of the bolts 99 and serve as washers. The through-holes 95 are examples of a second through-hole in CLAIMS.

(Relationship Between Lower Surface S4 of Tubular Member 20 and Upper Surface S3 of Connecting Member 80)

In the heating device 100 according to this embodiment, projections and recesses are formed on the upper surface S3 of the connecting member 80. As a result, a portion of the lower surface S4 of the tubular member 20 is in contact with the upper surface S3 of the connecting member 80, and the remaining portion of the lower surface S4 of the tubular member 20 is not in contact with the upper surface S3 of the connecting member 80. This point will be described in detail below.

As illustrated in FIGS. 3 and 4, an outer edge line Lx of the lower surface S4 of the tubular member 20 includes portions (hereinbelow, "outer circumferential portions Lx1") overlapping a minimum virtual circle VC covering the lower surface S4 and portions (portions constituting the inner circumferential surfaces of the through-holes 25 and, hereinbelow, "inside portions Lx2") other than the outer circumferential portions Lx1. In the outer edge line Lx of the lower surface S4 of the tubular member 20, the outer circumferential portions Lx1 are portions defining the extreme outer circumferential surface of the lower flange portion 23, and the inside portions Lx2 are portions defining the inner circumferential surfaces of the through-holes 25. Note that, in order to show the positional relationship between the outer edge line Lx of the lower surface S4 of the tubular member 20 and the connecting member 80, FIGS. 5 and 6 illustrate the position of the outer edge line Lx as viewed in the Z-axis direction by a dashed line. The outer circumferential portions Lx1 in the outer edge line Lx of the lower surface S4 of the tubular member 20 are examples of a specific portion in CLAIMS.

As illustrated in FIGS. 5 and 6, in the heating device 100 according to this embodiment, the outside diameter of the upper surface S3 of the connecting member 80 is larger than the outside diameter of the lower surface S4 of the tubular member 20. Hence, the upper surface S3 of the connecting member 80 has a portion overlapping the outer edge line Lx (the outer circumferential portions Lx1 and the inside portions Lx2) of the lower surface S4 of the tubular member 20, as viewed in the Z-axis direction.

As illustrated in FIGS. 2, 5, and 6, the upper surface S3 of the connecting member 80 has a recess (a portion dented downward) 87. The recess 87 includes a belt-like outer circumferential portion 87a having a substantially uniform width over the entire outer circumference of the upper surface S3 of the connecting member 80, as viewed in the Z-axis direction, and substantially semicircular inside portions 87b extending inward from the outer circumferential portion 87a toward the positions where the bolt holes 85 are formed. As illustrated in FIGS. 5 and 6, when viewed in the Z-axis direction, the entire outer circumferential portions Lx1 of the outer edge line Lx of the lower surface S4 of the tubular member 20 overlap the outer circumferential portion 87a of the recess 87 formed in the upper surface S3 of the connecting member 80. Hence, the entire outer circumferential portions Lx1 are spaced from the upper surface S3 of the connecting member 80 in the Z-axis direction and are not in contact with the upper surface S3. Meanwhile, when viewed in the Z-axis direction, although some portions of the inside portions Lx2 of the outer edge line Lx of the lower surface S4 of the tubular member 20 overlap the outer circumferential portion 87a of the recess 87, the remaining portions do not overlap the outer circumferential portion 87a of the recess 87. However, the remaining portions overlap the inside portions 87b of the recess 87. Hence, the overall inside portions Lx2 are also spaced from the upper surface S3 of the connecting member 80 in the Z-axis direction and are not in contact with the upper surface S3. From the description above, in the heating device 100 according to this embodiment, the entire outer edge line Lx of the lower surface S4 of the tubular member 20 is spaced from the upper surface S3 of the connecting member 80 in the Z-axis direction and is not in contact with the upper surface S3.

(Relationship between Upper Surface S5 of Lower Flange Portion 23 of Tubular Member 20 and Lower Surfaces S6 of Spacers 90)

In the heating device 100 according to this embodiment, the lower surfaces S6 of the spacers 90 have projections and recesses. As a result, a portion of the upper surface S5 of the lower flange portion 23 of the tubular member 20 is in contact with the lower surfaces S6 of the spacers 90, and the remaining portion of the upper surface S5 of the lower flange portion 23 of the tubular member 20 is not in contact with the lower surfaces S6 of the spacers 90. This point will be described in detail below. The upper surface S5 of the lower flange portion 23 of the tubular member 20 is an example of a fifth surface in CLAIMS, and the lower surfaces S6 of the spacers 90 are examples of a sixth surface in CLAIMS.

As illustrated in FIG. 2, the side surface of the lower flange portion 23 of the tubular member 20 is parallel to the Z-axis direction. Hence, as illustrated in FIGS. 3 and 4, an outer edge line Ly of the upper surface S5 of the lower flange portion 23 of the tubular member 20 is aligned with the outer edge line Lx of the lower surface S4 of the tubular member 20, as viewed in the Z-axis direction. More specifically, the outer edge line Ly of the upper surface S5 of the lower flange portion 23 of the tubular member 20 includes portions (hereinbelow, "outer circumferential portions Ly1") overlapping a minimum virtual circle VC covering the upper surface S5 and portions (hereinbelow, "inside portions Ly2" constituting the inner circumferential surfaces of the through-holes 25) other than the outer circumferential portions Ly1. In the outer edge line Ly of the upper surface S5 of the lower flange portion 23 of the tubular member 20, the outer circumferential portions Ly1 are portions defining the extreme outer circumferential surface of the lower flange portion 23, and the inside portions Ly2 are portions defining the inner circumferential surfaces of the through-holes 25. In order to show the positional relationship between the outer edge line Ly of the upper surface S5 of the lower flange portion 23 of the tubular member 20 and the spacers 90, FIGS. 7 and 8 illustrate the position of the outer edge line Ly as viewed in the Z-axis direction by a dashed line.

As illustrated in FIGS. 7 and 8, in the heating device 100 according to this embodiment, the outside diameter of an area formed by the lower surfaces S6 of the two spacers 90 is larger than the outside diameter of the upper surface S5 of the lower flange portion 23 of the tubular member 20. Hence, the lower surfaces S6 of the spacers 90 have portions overlapping the outer edge line Ly (the outer circumferential portions Ly1 and the inside portions Ly2) of the upper surface S5 of the lower flange portion 23 of the tubular member 20, as viewed in the Z-axis direction.

As illustrated in FIGS. 2, 7, and 8, the lower surfaces S6 of the spacers 90 have recesses (portions dented upward) 97. The recesses 97 include belt-like outer circumferential portions 97a having a substantially uniform width over the entire outer circumferences of the lower surfaces S6 of the spacers 90 as viewed in the Z-axis direction, and substantially rectangular inside portions 97b extending inward from the outer circumferential portions 97a toward the positions where the through-holes 95 are formed. As illustrated in FIGS. 7 and 8, when viewed in the Z-axis direction, the entire outer circumferential portions Ly1 in the outer edge line Ly of the upper surface S5 of the lower flange portion 23 of the tubular member 20 overlap the outer circumferential portions 97a of the recesses 97 formed in the lower surfaces S6 of the spacers 90. Hence, the entire outer circumferential portions Ly1 are spaced from the lower surfaces S6 of the spacers 90 in the Z-axis direction and are not in contact with the lower surfaces S6. Meanwhile, when viewed in the Z-axis direction, although some portions of the inside portions Ly2 of the outer edge line Ly of the upper surface S5 of the lower flange portion 23 of the tubular member 20 overlap the outer circumferential portions 97a of the recesses 97, the remaining portions do not overlap the outer circumferential portions 97a of the recesses 97. However, the remaining portions overlap the inside portions 97b of the recesses 97. Hence, the overall inside portions Ly2 are also spaced from the lower surfaces S6 of the spacers 90 in the Z-axis direction and are not in contact with the lower surfaces S6. From the description above, in the heating device 100 according to this embodiment, the entire outer edge line Ly of the upper surface S5 of the lower flange portion 23 of the tubular member 20 is spaced from the lower surfaces S6 of the spacers 90 in the Z-axis direction and is not in contact with the lower surfaces S6.

A-3. Advantages of this Embodiment

As has been described above, the heating device 100 according to this embodiment is a holding device including: the plate-like member 10 having the holding surface S1 extending substantially perpendicular to the Z-axis direction, and the back surface S2 on the side opposite to the holding surface S1; and the tubular member 20 extending in the Z-axis direction and made of ceramic. The holding device holds an object on the holding surface S1 of the plate-like member 10. The tubular member 20 is joined to the back surface S2 of the plate-like member 10 at the upper end thereof and has the lower flange portion 23 projecting in the plane direction at the lower end thereof. The lower flange portion 23 has the through-holes 25 extending in the Z-axis direction. The heating device 100 according to this embodiment further includes the connecting member 80 disposed below the tubular member 20. The connecting member 80 has the bolt holes 85 that are open in the upper surface S3 of the connecting member 80. The bolt holes 85 are to be screwed with the bolts 99 inserted through the through-holes 25 in the lower flange portion 23 of the tubular member 20. In the heating device 100 according to this embodiment, a portion of the lower surface S4 of the tubular member 20 is in contact with the upper surface S3 of the connecting member 80, and, in the outer edge line Lx of the lower surface S4 of the tubular member 20, the outer circumferential portions Lx1, which are portions overlapping the minimum virtual circle VC covering the lower surface S4, are not in contact with the upper surface S3 of the connecting member 80.

The outer edge line Lx portion of the lower surface S4 (the end face on the side facing the connecting member 80) of the tubular member 20 described above is a portion where chipping of the tubular member 20 due to contact with the connecting member 80 is likely to occur when there is a slight inclination between the tubular member 20 and the connecting member 80 in fastening together the tubular member 20 and the connecting member 80 with the bolts 99. In particular, in the outer edge line Lx of the lower surface S4 of the tubular member 20, the outer circumferential portions Lx1 (i.e., the extreme outer circumferential portions of the outer edge line Lx), which are portions overlapping the minimum virtual circle VC covering the lower surface S4, are portions where the above-described chipping is most likely to occur. As described above, in the heating device 100 according to this embodiment, the outer circumferential portions Lx1 in the outer edge line Lx of the lower surface S4 of the tubular member 20 are not in contact with the upper surface S3 of the connecting member 80. Hence, in the heating device 100 according to this embodiment, even when there is a slight inclination between the aforementioned two members, it is possible to prevent or reduce contact between the outer circumferential portions Lx1 in the outer edge line Lx of the lower surface S4 of the tubular member 20 and the connecting member 80. As a result, it is possible to prevent or reduce the occurrence of chipping of the tubular member 20.

In the heating device 100 according to this embodiment, the entire outer edge line Lx of the lower surface S4 of the tubular member 20 is not in contact with the upper surface S3 of the connecting member 80. Hence, in the heating device 100 according to this embodiment, it is possible to more reliably prevent or reduce the occurrence of chipping of the tubular member 20.

In the heating device 100 according to this embodiment, the upper surface S3 of the connecting member 80 has a portion overlapping the outer circumferential portions Lx1 in the outer edge line Lx of the lower surface S4 of the tubular member 20, as viewed in the Z-axis direction, and the upper surface S3 of the connecting member 80 and the outer circumferential portions Lx1 in the outer edge line Lx of the lower surface S4 of the tubular member 20 are spaced from each other in the Z-axis direction. Hence, in the heating device 100 according to this embodiment, it is possible to prevent or reduce the occurrence of chipping of the tubular member 20, regardless of the size relationship between the outside diameter of the lower flange portion 23 of the tubular member 20 and the outside diameter of the connecting member 80.

The heating device 100 according to this embodiment further includes the spacers 90 disposed above the lower flange portion 23 of the tubular member 20. The spacers 90 have the through-holes 95. The through-holes 95 in the spacers 90 are holes that communicate with the through-holes 25 in the lower flange portion 23 of the tubular member 20 and through which the bolts 99 are inserted. In the heating device 100 according to this embodiment, a portion of the upper surface S5 of the lower flange portion 23 of the tubular member 20 is in contact with the lower surfaces S6 of the spacers 90, and the entire outer edge line Ly of the upper surface S5 of the lower flange portion 23 is not in contact with the lower surfaces S6 of the spacers 90. In a form in which the tubular member 20 and the connecting member 80 are fastened together using the spacers 90, the outer edge line Ly portion of the above-described upper surface S5 (the end face on the side facing the spacers 90) of the lower flange portion 23 of the tubular member 20 is a portion where chipping of the tubular member 20 due to contact with the spacers 90 is likely to occur when there is a slight inclination between the spacers 90 and the tubular member 20. As described above, in the heating device 100 according to this embodiment, the entire outer edge line Ly of the upper surface S5 of the lower flange portion 23 of the tubular member 20 is not in contact with the lower surfaces S6 of the spacers 90. Hence, in the heating device 100 according to this embodiment, even when there is a slight inclination between the aforementioned two members, it is possible to prevent or reduce contact between the outer edge line Ly portion of the upper surface S5 of the lower flange portion 23 of the tubular member 20 and the spacers 90. As a result, it is possible to prevent or reduce the occurrence of chipping of the tubular member 20.

In the heating device 100 according to this embodiment, the lower flange portion 23 of the tubular member 20 has the plurality of through-holes 25, and the connecting member 80 has the plurality of bolt holes 85 into which the plurality of bolts 99 inserted through the plurality of through-holes 25 in the lower flange portion 23 of the tubular member 20 are to be screwed. Hence, in the heating device 100 according to this embodiment, in fastening together the tubular member 20 and the connecting member 80 with the plurality of bolts 99, a slight inclination between the tubular member 20 and the connecting member 80 is likely to occur due to variation in the fastening force of the bolts 99, and thus, the above-described chipping is likely to occur. However, in the heating device 100 according to this embodiment, as described above, because the outer circumferential portions Lx1 in the outer edge line Lx of the lower surface S4 of the tubular member 20 are not in contact with the upper surface S3 of the connecting member 80, even when there is a slight inclination between the aforementioned two members, it is possible to prevent or reduce contact between the outer circumferential portions Lx1 in the outer edge line Lx of the lower surface S4 of the tubular member 20 and the connecting member 80. As a result, it is possible to prevent or reduce the occurrence of chipping of the tubular member 20.

The heating device 100 according to this embodiment further includes the bolts 99. Hence, according to the heating device 100 of this embodiment, in the heating device 100 having the bolts 99 for fastening together the tubular member 20 and the connecting member 80, it is possible to prevent or reduce contact between the outer circumferential portions Lx1 in the outer edge line Lx of the lower surface S4 of the tubular member 20 and the connecting member 80. As a result, it is possible to prevent or reduce the occurrence of chipping of the tubular member 20.

The heating device 100 according to this embodiment further includes the heater electrode 50, which is an internal electrode provided inside the plate-like member 10. Hence, according to the heating device 100 of this embodiment, in the heating device 100 having the internal electrode provided inside the plate-like member 10, it is possible to prevent or reduce contact between the outer circumferential portions Lx1 in the outer edge line Lx of the lower surface S4 of the tubular member 20 and the connecting member 80. As a result, it is possible to prevent or reduce the occurrence of chipping of the tubular member 20.

B. Modification

The technique disclosed in this specification is not limited to the above-described embodiment, but may be modified in various forms within a scope not departing from the spirit thereof, and, for example, the following modification is possible.

The configuration of the heating device 100 according to the above-described embodiment is merely an example, and various modifications are possible. For example, in the above-described embodiment, although the entire outer edge line Lx of the lower surface S4 of the tubular member 20 is not in contact with the upper surface S3 of the connecting member 80, it is also possible to configure such that the outer circumferential portions Lx1 in the outer edge line Lx are not in contact with the upper surface S3 of the connecting member 80, and (at least a portion of) the inside portions Lx2 are in contact with the upper surface S3 of the connecting member 80.

In the above-described embodiment, although a configuration is realized in which the outer circumferential portions Lx1 in the outer edge line Lx of the lower surface S4 of the tubular member 20 are not in contact with the upper surface S3 of the connecting member 80 due to the provision of the recess 87 in the upper surface S3 of the connecting member 80, this configuration may be realized by making the outside diameter of the upper surface S3 of the connecting member 80 smaller than the outside diameter of the lower surface S4 of the tubular member 20.

In the above-described embodiment, although the entire outer edge line Ly of the upper surface S5 of the lower flange portion 23 of the tubular member 20 is not in contact with the lower surfaces S6 of the spacers 90, it is also possible to configure such that the outer circumferential portions Ly1 of the outer edge line Ly are not in contact with the lower surfaces S6 of the spacers 90, and (at least a portion of) the inside portions Ly2 are in contact with the lower surfaces S6 of the spacers 90. It is also possible to configure such that the entire outer edge line Ly of the upper surface S5 of the lower flange portion 23 of the tubular member 20 is in contact with the lower surfaces S6 of the spacers 90. It is also possible to configure such that the heating device 100 does not have the spacers 90.

In the above-described embodiment, although the lower flange portion 23 of the tubular member 20 has the plurality of through-holes 25, and the connecting member 80 has the plurality of bolt holes 85 into which the plurality of bolts 99 inserted through the plurality of through-holes 25 in the lower flange portion 23 of the tubular member 20 are to be screwed, it is also possible to configure such that the lower flange portion 23 of the tubular member 20 has one through-hole 25, and the connecting member 80 has one bolt hole 85 into which one bolt 99 inserted through the one through-hole 25 in the lower flange portion 23 of the tubular member 20 is to be screwed.

In the above-described embodiment, although the heating device 100 has the heater electrode 50 serving as the internal electrode provided inside the plate-like member 10, the heating device 100 may have another electrode (for example, an RF electrode) serving as the internal electrode provided inside the plate-like member 10.

The materials for forming the respective members constituting the heating device 100 according to the above-described embodiment are merely examples, and the respective members may be made of other materials. For example, in the above-described embodiment, although the plate-like member 10 is made of ceramic, the plate-like member 10 may be made of a material other than ceramic (for example, metal, such as aluminum or an aluminum alloy). In the above-described embodiment, although the connecting member 80 and the spacers 90 are made of metal, the connecting member 80 and the spacers 90 may be made of materials other than metal.

In the heating device 100 according to the above-described embodiment, although the through-holes 26 in the tubular member 20 and the through-holes 86 in the connecting member 80 are formed to define a space to be used as a gas flow path for supplying purge gas or as a space for accommodating a high-frequency body, these holes may be omitted, or a hole for defining another space may be additionally formed.

The technique disclosed in this specification may be applied not only to heating devices, but also to other holding devices that have a plate-like member, a ceramic tubular member, and a connecting member and hold an object on a surface of the plate-like member.

REFERENCE SIGNS LIST 10 plate-like member, 12 recess, 20 tubular member, 21 body part, 22 upper flange portion, 23 lower flange portion, 24 through-hole, 25 through-hole, 26 through-hole, 30 joint part, 50 heater electrode, 52 via conductor, 54 feeding electrode, 56 metal brazing material, 70 terminal member, 80 connecting member, 84 through-hole, 85 bolt hole, 86 through-hole, 87 recess, 87a outer circumferential portion, 87b inside portion, 88 recess, 89 O ring, 90 spacer, 95 through-hole, 97 recess, 97a outer circumferential portion, 97b inside portion, 99 bolt, 100 heating device, Lx1 outer circumferential portion, Lx2 inside portion, Lx outer edge line, Ly1 outer circumferential portion, Ly2 inside portion, Ly outer edge line, S1 holding surface, S2 back surface, S3 upper surface, S4 lower surface, S5 upper surface, S6 lower surface, VC virtual circle, W semiconductor wafer

What is claimed is:

1. A holding device comprising:
a plate-shaped member having a first surface substantially perpendicular to a first direction, and a second surface on a side opposite to the first surface; and
a tubular member extending in the first direction, made of ceramic, joined to the second surface of the plate-shaped member at an end of the tubular member on one side in the first direction, and having a flange portion at an end of the tubular member on another side in the first direction, the flange portion projecting in a direction substantially perpendicular to the first direction and having a first through-hole extending in the first direction, the holding device holding an object on the first surface of the plate-shaped member, wherein
the holding device further comprises a connecting member disposed on the other side of the tubular member in the first direction, the connecting member having a hole in a third surface, which is an end face of the connecting member on the one side in the first direction, into which a fastening member inserted through the first through-hole in the flange portion is to be screwed, and a portion of a fourth surface, which is an end face of the tubular member on the other side in the first direction, is in contact with the third surface of the connecting member, and a specific portion, which is a portion in an outer edge line of the fourth surface of the tubular member, the portion overlapping a minimum virtual circle covering the fourth surface, is not in contact with the third surface of the connecting member.

2. The holding device according to claim 1, wherein an entirety of the outer edge line of the fourth surface of the tubular member is not in contact with the third surface of the connecting member.

3. The holding device according to claim 1, wherein
the third surface of the connecting member has a portion overlapping the specific portion in the outer edge line of the fourth surface of the tubular member, as viewed in the first direction, and
the third surface of the connecting member and the specific portion in the outer edge line of the fourth surface of the tubular member are spaced from each other in the first direction.

4. The holding device according to claim 1, further comprising a spacer disposed on the one side of the flange portion in the first direction and having a second through-hole that communicates with the first through-hole in the flange portion and through which the fastening member is inserted,
wherein a portion of a fifth surface, which is an end face of the flange portion on the one side in the first direction, is in contact with a sixth surface, which is an end face of the spacer on the other side in the first direction, and an entirety of an outer edge line of the fifth surface of the flange portion is not in contact with the sixth surface of the spacer.

5. The holding device according to claim 1, wherein
the flange portion of the tubular member has a plurality of the first through-holes, and
the connecting member has a plurality of the holes into which a plurality of the fastening members inserted through the plurality of the first through-holes in the flange portion are to be screwed.

6. The holding device according to claim 1, further comprising the fastening member.

7. The holding device according to claim 1, further comprising an internal electrode provided inside the plate-shaped member.

8. The holding device according to claim 2, wherein
the third surface of the connecting member has a portion overlapping the specific portion in the outer edge line of the fourth surface of the tubular member, as viewed in the first direction, and
the third surface of the connecting member and the specific portion in the outer edge line of the fourth surface of the tubular member are spaced from each other in the first direction.

9. The holding device according to claim 2, further comprising:
a spacer disposed on the one side of the flange portion in the first direction and having a second through-hole that communicates with the first through-hole in the flange portion and through which the fastening member is inserted,
wherein a portion of a fifth surface, which is an end face of the flange portion on the one side in the first direction, is in contact with a sixth surface, which is an end face of the spacer on the other side in the first direction, and an entirety of an outer edge line of the fifth surface of the flange portion is not in contact with the sixth surface of the spacer.

10. The holding device according to claim 3, further comprising:
a spacer disposed on the one side of the flange portion in the first direction and having a second through-hole that communicates with the first through-hole in the flange portion and through which the fastening member is inserted,
wherein a portion of a fifth surface, which is an end face of the flange portion on the one side in the first direction, is in contact with a sixth surface, which is an end face of the spacer on the other side in the first direction, and an entirety of an outer edge line of the fifth surface of the flange portion is not in contact with the sixth surface of the spacer.

11. The holding device according to claim 2, wherein
the flange portion of the tubular member has a plurality of the first through-holes, and
the connecting member has a plurality of the holes into which a plurality of the fastening members inserted through the plurality of the first through-holes in the flange portion are to be screwed.

12. The holding device according to claim 3, wherein
the flange portion of the tubular member has a plurality of the first through-holes, and
the connecting member has a plurality of the holes into which a plurality of the fastening members inserted through the plurality of the first through-holes in the flange portion are to be screwed.

13. The holding device according to claim 4, wherein
the flange portion of the tubular member has a plurality of the first through-holes, and
the connecting member has a plurality of the holes into which a plurality of the fastening members inserted through the plurality of the first through-holes in the flange portion are to be screwed.

* * * * *